(12) United States Patent
Hung et al.

(10) Patent No.: US 11,538,813 B2
(45) Date of Patent: Dec. 27, 2022

(54) STATIC RANDOM ACCESS MEMORY AND METHOD FOR FABRICATING THE SAME

(71) Applicant: UNITED MICROELECTRONICS CORP., Hsin-Chu (TW)

(72) Inventors: Ching-Wen Hung, Tainan (TW); Chun-Hsien Lin, Tainan (TW); Chien-Hung Chen, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/923,117

(22) Filed: Jul. 8, 2020

(65) Prior Publication Data

US 2021/0391339 A1 Dec. 16, 2021

(30) Foreign Application Priority Data

Jun. 11, 2020 (CN) .......................... 202010529866.7

(51) Int. Cl.
| | |
|---|---|
| *H01L 27/11* | (2006.01) |
| *H01L 27/092* | (2006.01) |
| *H01L 21/8238* | (2006.01) |
| *H01L 29/08* | (2006.01) |
| *H01L 29/417* | (2006.01) |
| *H01L 21/285* | (2006.01) |
| *H01L 29/45* | (2006.01) |

(52) U.S. Cl.
CPC .... *H01L 27/1104* (2013.01); *H01L 21/28518* (2013.01); *H01L 21/823814* (2013.01); *H01L 21/823821* (2013.01); *H01L 21/823871* (2013.01); *H01L 27/0924* (2013.01); *H01L 29/0847* (2013.01); *H01L 29/41791* (2013.01); *H01L 29/45* (2013.01)

(58) Field of Classification Search
CPC ............ H01L 27/1104; H01L 27/0924; H01L 27/0886; H01L 21/823821; H01L 21/823871; H01L 21/823814; H01L 21/28518; H01L 29/41791; H01L 29/0847; H01L 29/45
See application file for complete search history.

(56) References Cited

U.S. PATENT DOCUMENTS

| | | | | |
|---|---|---|---|---|
| 5,317,187 | A * | 5/1994 | Hindman | .......... H01L 21/76843 257/659 |
| 6,902,963 | B2 | 6/2005 | Kim et al. | |
| 7,994,049 | B2 * | 8/2011 | Futase | ............... H01L 21/76876 438/629 |
| 8,809,963 | B2 | 8/2014 | Liaw | |
| 9,966,309 | B2 * | 5/2018 | Ting | .................. H01L 21/32115 |

(Continued)

*Primary Examiner* — Michael M Trinh
(74) *Attorney, Agent, or Firm* — Winston Hsu

(57) ABSTRACT

A method for fabricating a static random access memory (SRAM) includes the steps of: forming a gate structure on a substrate; forming an epitaxial layer adjacent to the gate structure; forming a first interlayer dielectric (ILD) layer around the gate structure; transforming the gate structure into a metal gate; forming a contact hole exposing the epitaxial layer, forming a barrier layer in the contact hole, forming a metal layer on the barrier layer, and then planarizing the metal layer and the barrier layer to form a contact plug. Preferably, a bottom portion of the barrier layer includes a titanium rich portion and a top portion of the barrier layer includes a nitrogen rich portion.

7 Claims, 4 Drawing Sheets

(56) References Cited

U.S. PATENT DOCUMENTS

| | | | |
|---|---|---|---|
| 2007/0099414 A1* | 5/2007 | Frohberg | H01L 23/53238 |
| | | | 257/E21.585 |
| 2008/0277736 A1* | 11/2008 | Nakajima | H01L 21/28079 |
| | | | 257/377 |
| 2019/0103311 A1* | 4/2019 | Tsai | H01L 21/28088 |
| 2019/0279992 A1* | 9/2019 | Yu | H01L 21/76802 |
| 2020/0020785 A1* | 1/2020 | Chang | H01L 29/785 |

* cited by examiner

STATIC RANDOM ACCESS MEMORY AND METHOD FOR FABRICATING THE SAME

BACKGROUND OF THE INVENTION

1. Field of the Invention

The invention relates to a static random access memory (SRAM), and more particularly to a SRAM having contact plug with gradient concentration barrier layer.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

However, as pitch of the exposure process decreases, it has been difficult for current SRAM architecture to produce desirable patterns. Hence, how to enhance the current SRAM architecture for improving exposure quality has become an important task in this field.

SUMMARY OF THE INVENTION

According to an embodiment of the present invention, a method for fabricating a static random access memory (SRAM) includes the steps of: forming a gate structure on a substrate; forming an epitaxial layer adjacent to the gate structure; forming a first interlayer dielectric (ILD) layer around the gate structure; transforming the gate structure into a metal gate; forming a contact hole exposing the epitaxial layer, forming a barrier layer in the contact hole, forming a metal layer on the barrier layer, and then planarizing the metal layer and the barrier layer to form a contact plug. Preferably, a bottom portion of the barrier layer includes a titanium rich portion and a top portion of the barrier layer includes a nitrogen rich portion.

According to another aspect of the present invention, a static random access memory (SRAM) includes: a gate structure on a substrate; an epitaxial layer adjacent to the gate structure; a first contact plug on the epitaxial layer; a second contact plug on the gate structure; a first interlayer dielectric (ILD) layer around the first contact plug, the second contact plug, and the gate structure; a third contact plug on the first contact plug; a fourth contact plug on the second contact plug; and a second ILD layer around the third contact plug and the fourth contact plug.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
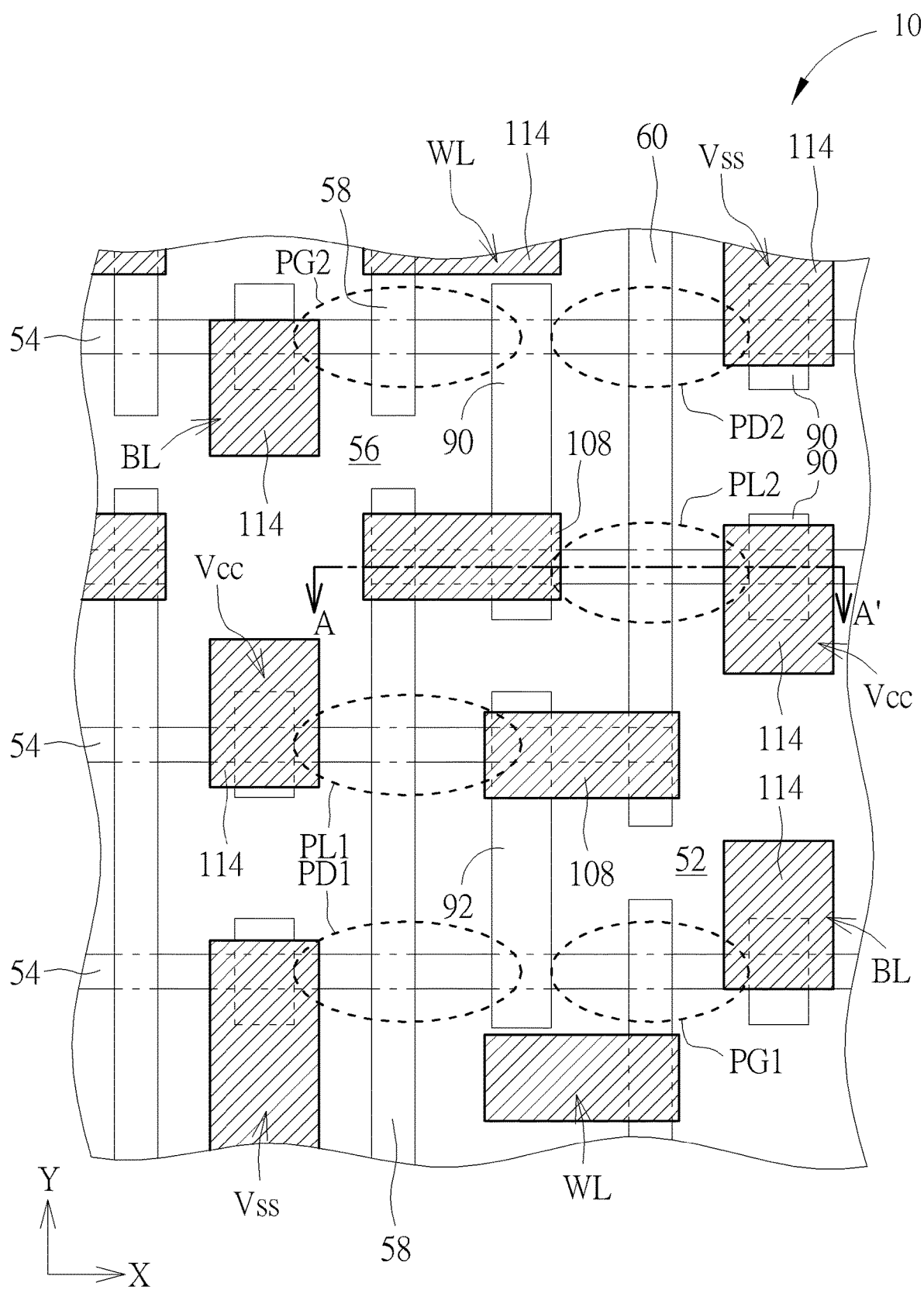
FIG. 1 illustrates a layout diagram of a static random access memory (SRAM) according to an embodiment of the present invention.
Figure 2:
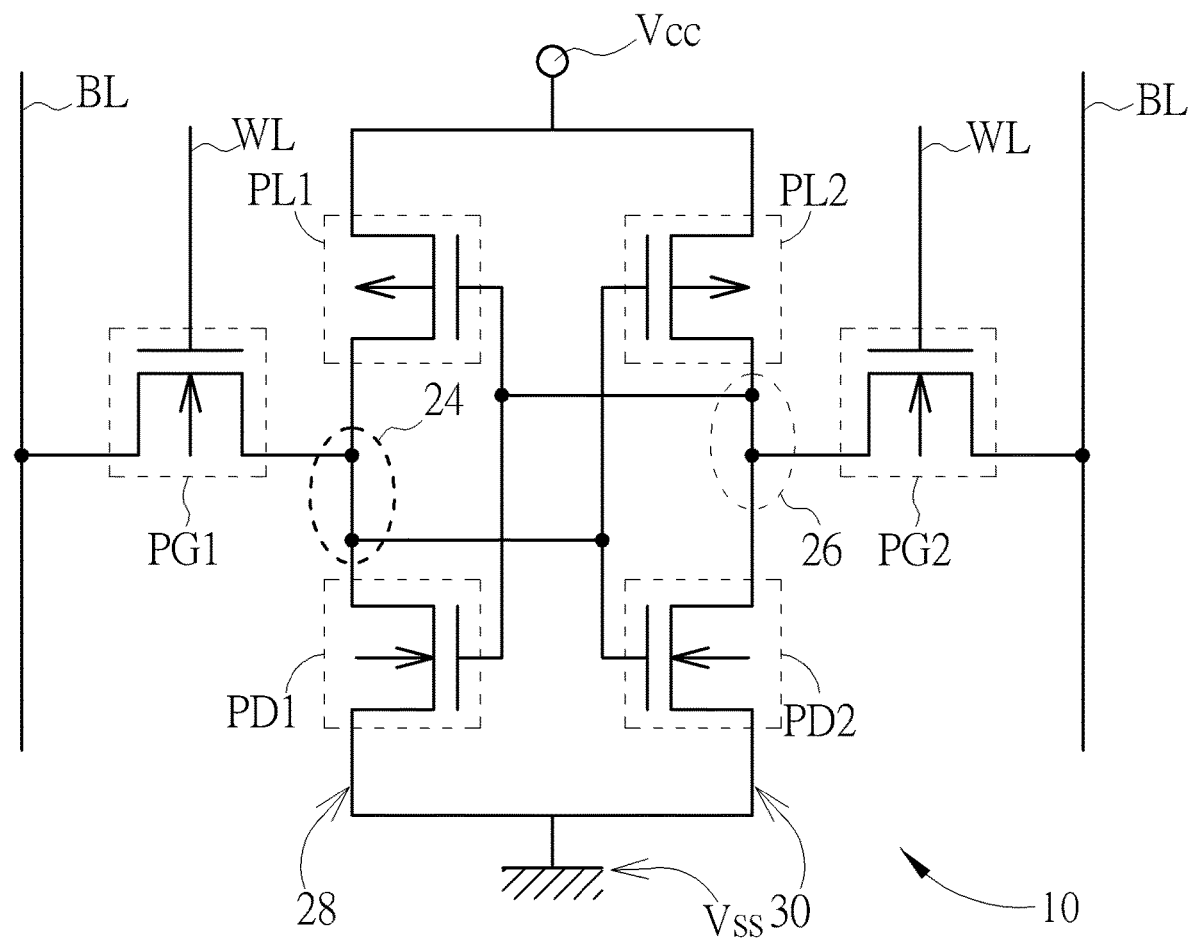
FIG. 2 illustrates a circuit diagram of a six-transistor SRAM (6T-SRAM) cell of a SRAM of the present invention.
Figure 3:
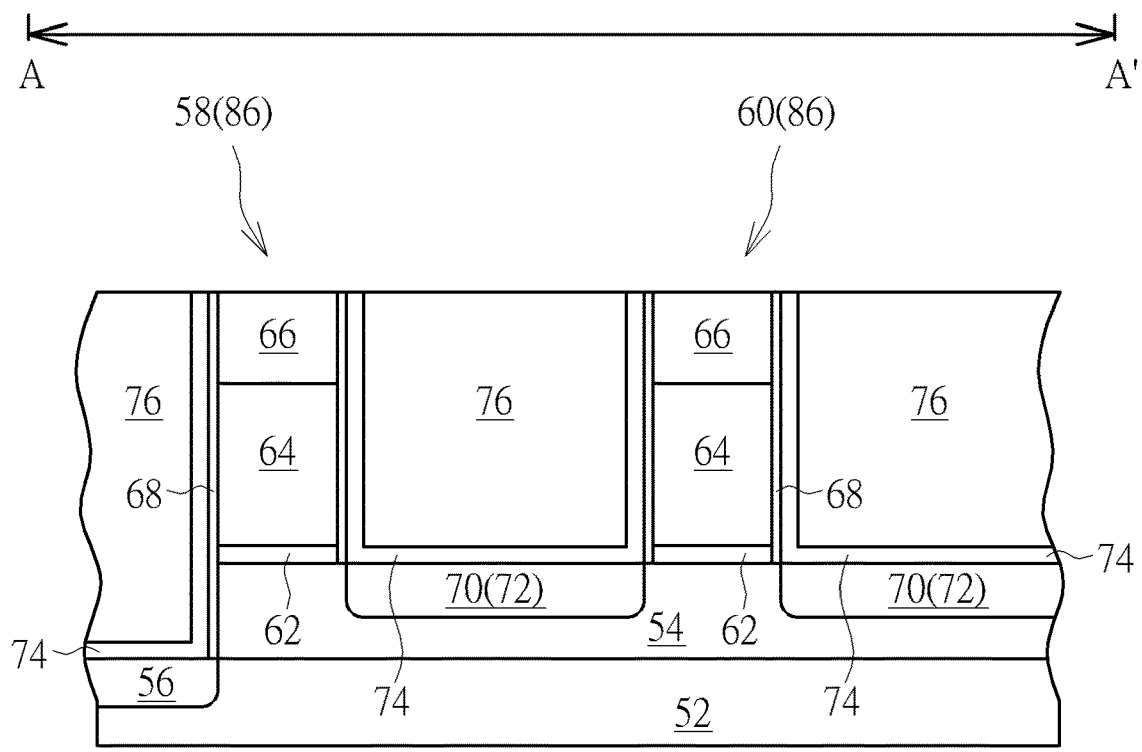
FIGS. 3-6 illustrate a method for fabricating a semiconductor device according to an embodiment of the present invention.
Figure 4:
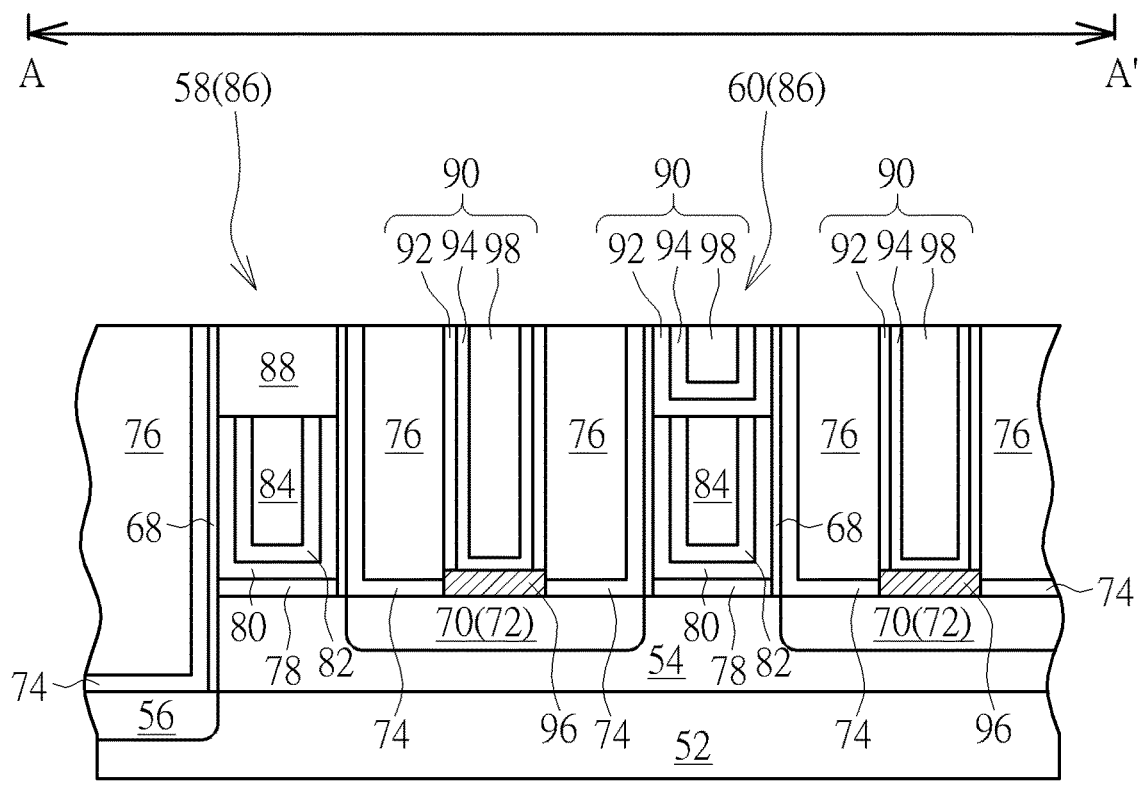

Referring to FIGS. 1-2, FIG. 1 illustrates a layout diagram of a static random access memory (SRAM) according to an embodiment of the present invention and FIG. 2 illustrates a circuit diagram of a six-transistor SRAM (6T-SRAM) cell of a SRAM of the present invention. As shown in FIGS. 1-2, the SRAM device of the present invention preferably includes at least one SRAM cell, each SRAM cell including a six-transistor SRAM (6T-SRAM) cell 10.

In this embodiment, each 6T-SRAM cell 10 is composed of a first pull-up transistor PL1, a second pull-up transistor PL2, a first pull-down transistor PD1, a second pull-down transistor PD2, a first access transistor PG1 and a second access transistor PG2. These six transistors constitute a set of flip-flops. The first and the second pull-up transistors PL1 and PL2, and the first and the second pull-down transistors PD1 and PD2 constitute a latch that stores data in the storage nodes 24 and 26. Since the first and the second pull-up transistors PL1 and PL2 act as power load devices, they can be replaced by resistors. Under this circumstance, the static random access memory becomes a four-transistor SRAM (4T-SRAM). In this embodiment, the first and the second pull-up transistors PL1 and PL2 preferably share a source/drain region and electrically connect to a voltage source Vcc, the first and the second pull-down transistors PD1 and PD2 share a source/drain region and electrically connect to a voltage source Vss.

Preferably, the first and the second pull-up transistors PL1 and PL2 of the 6T-SRAM cell 10 are composed of p-type metal oxide semiconductor (PMOS) transistors; the first and the second pull-down transistors PD1 and PD2, and first and the second access transistors PG1 and PG2 are composed of n-type metal oxide semiconductor (NMOS) transistors. The first pull-up transistor PL1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PL2 and the second pull-down transistor PD2 constitute another inverter and a series circuit 30. One end of the series circuit 30 is connected to the voltage source Vcc and the other end of the series circuit 30 is connected to the voltage source Vss.

The storage node 24 is connected to the respective gates of the second pull-down transistor PD2 and the second pull-up transistor PL2. The storage node 24 is also connected to the drains of the first pull-down transistor PD1, the first pull-up transistor PL1, and the first access transistor PG1. Similarly, the storage node 26 is connected to the respective gates of the first pull-down transistor PD1 and first the pull-up transistor PL1. The storage node 26 is also connected to the drains of the second pull-down transistor PD2, the second pull-up transistor PL2, and the second access transistor PG2. The gates of the first and the second access transistors PG1 and PG2 are respectively coupled to a word line (WL), and the sources are coupled to a relative data line (BL).

Referring to FIGS. 3-6, FIGS. 3-6 illustrate a method for fabricating a semiconductor device according to an embodiment of the present invention. As shown in FIG. 1, a substrate 52, such as a silicon substrate or silicon-on-insulator (SOI) substrate is provided, at least a fin-shaped structure 54 is formed on the substrate 52, and the bottom of the fin-shaped structure 54 is surrounded by an insulating layer made of silicon oxide to form a shallow trench isolation (STI) 56. It should be noted that even though this embodiment pertains to a FinFET process, it would also be desirable to apply the process of this embodiment to a non-planar MOS transistor, which is also within the scope of the present invention.

The fin-shaped structure 54 of this embodiment is preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 54 of this embodiment could also be obtained by first forming a patterned mask (not shown) on the substrate, 52, and through an etching process, the pattern of the patterned mask is transferred to the substrate 52 to form the fin-shaped structure 54. Moreover, the formation of the fin-shaped structure 54 could also be accomplished by first forming a patterned hard mask (not shown) on the substrate 52, and a semiconductor layer composed of silicon germanium is grown from the substrate 52 through exposed patterned hard mask via selective epitaxial growth process to form the corresponding fin-shaped structure 54. These approaches for forming fin-shaped structure 54 are all within the scope of the present invention.

Next, gate structures 58, 60 or dummy gates are formed on the substrate 52. In this embodiment, the formation of the gate structures 58, 60 could be accomplished by sequentially depositing a gate dielectric layer 62, a gate material layer 64, and a selective hard mask 66 on the substrate 52, conducting a pattern transfer process by using a patterned resist (not shown) as mask to remove part of the hard mask 66, part of the gate material layer 64, and part of the gate dielectric layer 62, and then stripping the patterned resist to form dummy gates or gate structures 58, 60 on the fin-shaped structure 54. Each of the gate structures 58, 60 preferably includes a patterned gate dielectric layer 62, a patterned material layer 64, and a patterned hard mask 66, in which the gate dielectric layer 62 includes silicon oxide and the gate material layer 64 includes polysilicon, but not limited thereto.

Next, at least a spacer 68 is formed on sidewalls of each of the gate structures 58, 60, a source/drain region 70 and epitaxial layers 72 are formed in the fin-shaped structure 54 and/or substrate 52 adjacent to two sides of the spacer 68. In this embodiment, the spacer 68 could be a single spacer or a composite spacer. For instance, the spacer 68 could further include an offset spacer (not shown) and a main spacer (not shown), and the spacer 68 could be selected from the group consisting of $SiO_2$, SiN, SiON, and SiCN. The source/drain region 70 and epitaxial layers 72 could include different dopants or different materials depending on the type of transistor being fabricated. For instance, the source/drain region 70 could include p-type or n-type dopants and the epitaxial layers 72 could include silicon germanium (SiGe), silicon carbide (SiC), or silicon phosphide (SiP).

Next, a contact etch stop layer (CESL) 74 composed of silicon nitride could be selectively formed on the substrate 52 to cover the gate structures 58, 60, and an interlayer dielectric (ILD) layer 76 is formed on the CESL 74. Next, a planarizing process, such as chemical mechanical polishing (CMP) process is conducted to remove part of the ILD layer 76 and part of the CESL 74 to expose the hard masks 66 so that the top surfaces of the hard masks 66 and the ILD layer 76 are coplanar.

Next, a replacement metal gate (RMG) process is conducted to transform the gate structures 58, 60 into metal gates. For instance, a selective dry etching or wet etching process could be conducted by using etchant including ammonium hydroxide ($NH_4OH$) or tetramethylammonium hydroxide (TMAH) to remove the hard mask 66, the gate material layer 64, and gate dielectric layer 62 in the gate structures 58, 60 for forming recesses (not shown) in the ILD layer 76.

Next, an interfacial layer 78, a high-k dielectric layer 80, a selective bottom barrier metal (BBM) layer, a work function metal layer 82, and a low resistance metal layer 84 are sequentially formed in the recesses, and a planarizing process such as CMP is conducted to remove part of the low resistance metal layer 84, part of the work function metal layer 82, and part of the high-k dielectric layer 80 to form metal gates 86.

In this embodiment, the high-k dielectric layer 80 is preferably selected from dielectric materials having dielectric constant (k value) larger than 4. For instance, the high-k dielectric layer 80 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. Preferably, the BBM layer could be selected from the group consisting of TiN and TaN, but not limited thereto.

In this embodiment, the work function metal layer 82 is formed for tuning the work function of the later formed metal gates to be appropriate in an NMOS or a PMOS. For an NMOS transistor, the work function metal layer 82 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 82 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 82 and the low resistance metal layer 84, in which the material of the barrier layer may include titanium (Ti), titanium nitride (TiN), tantalum (Ta) or tantalum nitride (TaN). Furthermore, the material of the low-resistance metal layer 84 may include copper (Cu), aluminum (Al), titanium aluminum (TiAl), cobalt tungsten phosphide (CoWP) or any combination thereof.

Next, part of the high-k dielectric layer 80, part of the BBM layer, part of the work function metal layer 82, and part of the low resistance metal layer 84 could be removed to form recesses (not shown), and a hard mask 88 could be formed in each of the recesses so that the top surfaces of the hard masks 88 and ILD layer 76 are coplanar. The hard masks 88 could be selected from the group consisting of silicon oxide, silicon nitride, silicon oxynitride, and silicon carbon nitride.

Next, a contact plug formation could be conducted to form contact plugs 90 electrically connected to the source/drain regions 70 and the gate structure 60. In this embodiment, the formation of contact plugs 90 could be accomplished by first removing part of the ILD layer 76 and part of the CESL 74 adjacent to two sides of the gate structures 60 and part or even all of the hard mask 88 directly on top of the gate structure 60 to form contact holes (not shown), in which the contact holes adjacent to two sides of the gate structure 60 preferably expose the epitaxial layers 72 while the contact hole directly on top of the gate structure 60 exposes the metal gate 86.

Next, a first barrier layer 92 and a second barrier layer 94 are deposited in sequence in each of the contact holes, in which the first barrier layer 92 and the second barrier layer 94 are formed conformally on the surface of the epitaxial layers 72 and inner sidewalls of the contact holes. In this embodiment, the first barrier layer 92 is selected from the group consisting of Ti, Co, Ni, and Pt, and most preferably Ti, and the second barrier layer 94 is selected from the group consisting of TiN and TaN.

After depositing the first barrier layer 92 and second barrier layer 94, a first thermal treatment process and a second thermal treatment process are conducted sequentially to form a silicide 96 on the surface of the epitaxial layers 72. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

After the two thermal treatment processes are conducted, a metal layer 98 is deposited to fully fill the contact holes. In this embodiment, the metal layer 98 is preferably composed of tungsten, but not limited thereto. Next, a planarizing process such as a CMP process is conducted to remove part of the metal layer 98, part of the second barrier layer 94, and part of the first barrier layer 92, and depending on the demand of the process also removing part of the ILD layer 76 for forming contact plugs 90 electrically connected to or directly contacting the epitaxial layers 72 and the gate structure 60.

Figure 5:
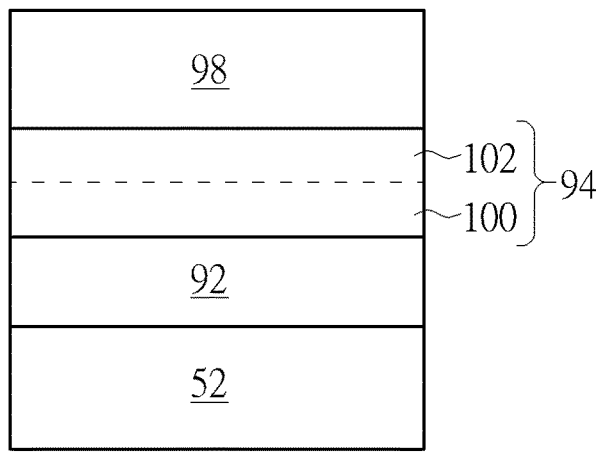

It should be noted that the second barrier layer 94 in this embodiment preferably includes titanium nitride (TiN) and the formation of the second barrier layer 94 is accomplished by conducting a deposition process and a treatment process alternately and repeatedly to form a second barrier layer 94 having gradient concentration of TiN. Referring to FIG. 5, FIG. 5 illustrates a method for forming the second barrier layer 94 according to an embodiment of the present invention. As shown in FIG. 5, the formation of the second barrier layer 94 includes the steps of first performing a first deposition process to form a first layer 100 in each of the contact holes, performing a first treatment process on the first layer 100, performing a second deposition process to form a second layer 102 on the first layer 100, and then performing a second treatment process on the second layer 102, in which the first deposition process and the second deposition process both involves deposition of TiN, the first treatment process and the second treatment process both include the injection of hydrogen gas and/or nitrogen gas, and the duration of the second treatment process for injecting reacting gas such as nitrogen gas is preferably greater than the duration of the first treatment process for injecting nitrogen gas.

In other words, by extending the time for injecting nitrogen gas during the second treatment process, the present invention preferably controls the nitrogen concentration in the second barrier layer 94 such that the nitrogen concentration in the first layer 100 is lower than the nitrogen concentration in the second layer 102 while the titanium concentration in the second layer 102 is lower than the titanium concentration in the first layer 100. Viewing from another perspective, the second barrier layer 94 closer to the substrate 52 preferably includes higher titanium concentration and lower nitrogen concentration while the second barrier layer 94 farther from the substrate 52 preferably includes lower titanium concentration and higher nitrogen concentration, in which the portion of the second barrier layer 94 closer to the substrate 52 having higher titanium concentration could be used to facilitate the formation of silicide 96 while the portion farther from the substrate 52 or closer to the metal layer 98 could be serving as metal barrier. Moreover, since higher nitrogen concentration closer to the substrate 52 could induce poor adhesion of the barrier layer and metal layer 98 onto the CESL thereby resulting metal loss and poor performance, the present invention preferably employs the aforementioned approach to adjust concentration of nitrogen atoms in the second barrier layer 94 for resolving this issue. It should be further noted that even though only two deposition processes and two treatment processes were conducted in this embodiment, the number of deposition process and treatment process as well as the number of TiN layers constituting the second barrier layer 94 could all be adjusted depending on the demand of product.

Figure 6:
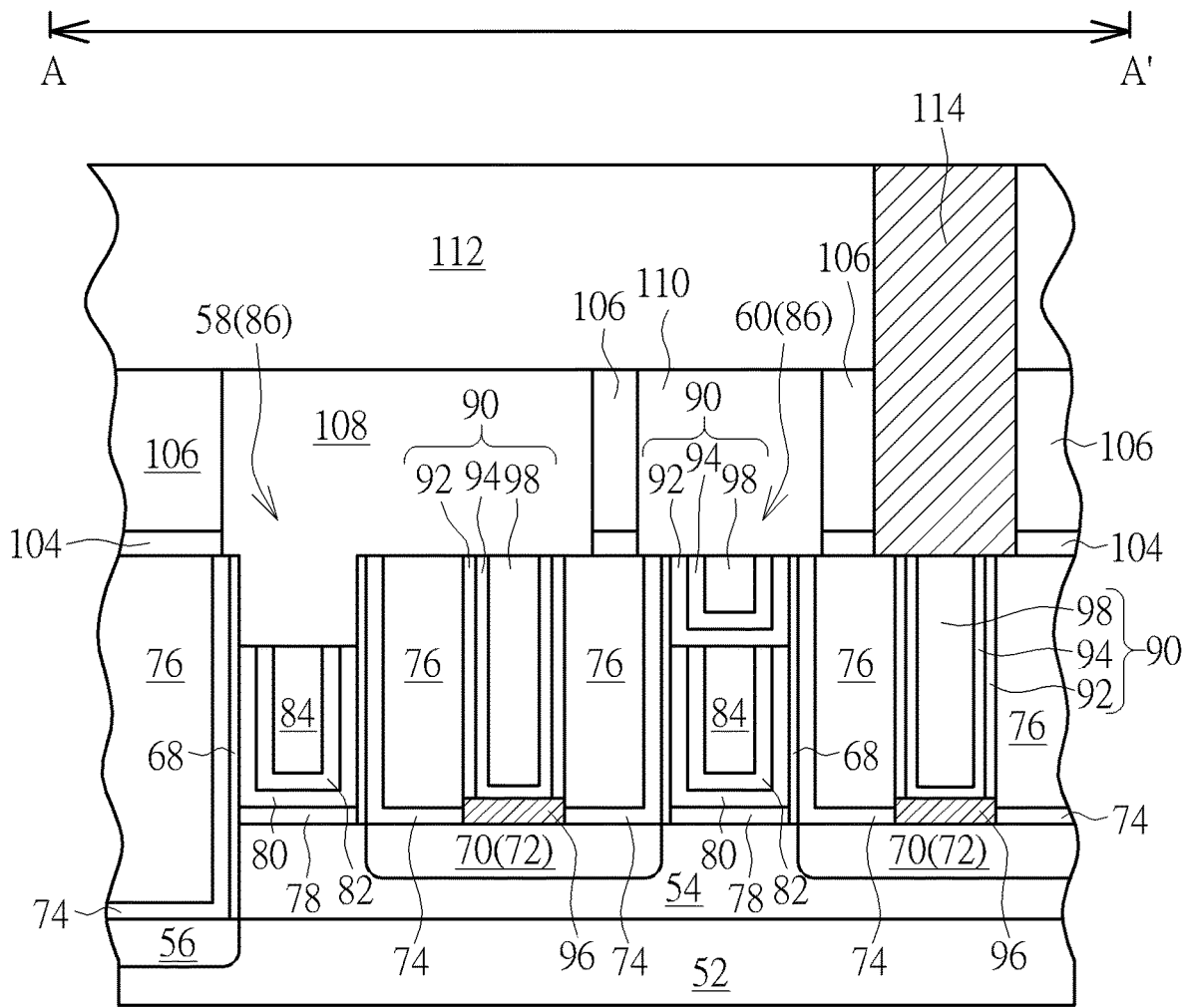

Next, as shown in FIG. 6, a stop layer 104 and another ILD layer 106 are formed on the ILD layer 76, and one or more photo-etching process is conducted to remove part of the ILD layer 106, part of the stop layer 104, and the hard mask 88 directly on the gate structure 58 to form contact holes (not shown). Next, conductive materials are deposited into each of the contact holes and a planarizing process such as CMP is conducted to form metal interconnections or contact plugs 108, 110 directly connecting the contact plugs 90 underneath, in which the contact plug 108 is connected to or directly contacting the gate structure 58 and the contact plug 90 between gate structures 58, 60 while the contact plug 110 is connected to or directly contacting the lower level contact plug 90 that is directly on top of the gate structure 60. Next, an inter-metal dielectric (IMD) layer 112 is formed on the ILD layer 106, one or more photo-etching process is conducted to remove part of the IMD layer 112, part of the ILD layer 106, and part of the stop layer 104 to form a contact hole, conductive materials are deposited into the contact hole, and a planarizing process such as CMP is conducted to form a metal interconnection 114 or contact plug directly contacting the contact plug 90 adjacent to the right side of the gate structure 60.

In this embodiment, the stop layer 104 could include nitrogen doped carbide (NDC), silicon nitride, silicon carbon nitride (SiCN), or combination thereof. Similar to the contact plugs 90 formed previously, each of the metal interconnection 114 or contact plugs 108, 110 could all be formed in the ILD layer 106 and IMD layer 112 through single damascene or dual damascene process. For instance, each of the contact plugs 108, 110 and the metal interconnection 114 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Overall, the present invention preferably conducts multiple deposition and treatment processes alternately to form a TiN barrier layer with gradient concentration during fabrication of SRAM device, in which the bottom portion of the barrier layer preferably includes a titanium rich portion while the top portion of the barrier layer preferably includes a nitrogen rich portion. According to the aforementioned embodiment, the bottom portion or portion closer to the substrate having higher titanium concentration could be used to facilitate the formation of silicide 96 while the top portion or portion farther from the substrate 52 and closer to the metal layer 98 could be serving as metal barrier. Since higher nitrogen concentration closer to the substrate 52 could induce poor adhesion of the barrier layer and metal layer 98 onto the CESL thereby resulting metal loss and poor performance, the present invention preferably employs the aforementioned approach to adjust concentration of nitrogen atoms in the second barrier layer 94 for resolving this issue.

Moreover, another embodiment of the present invention preferably divides the contact plug (typically referred to as M0PY contact plug) penetrating through two ILD layers 76, 106 and connecting the gate structure 60 into two portions, in which the top surface of the contact plug 90 within the lower level ILD layer 76 and directly on top of the gate structure 60 is even with the top surface of the contact plug 90 connecting to the source/drain region 70 and epitaxial layers 72 on adjacent two sides while the top surface of the contact plug 110 within the higher level ILD layer 106 and directly on the gate structure 60 is even with the top surface of the contact plug 108 connecting the lower level contact plug 90 and the gate structure 58 at the same time. By dividing the M0PY contact plug into upper and lower portions, it would be desirable to lower overall height of the contact plug and significantly reduce the occurrence of short circuit between adjacent devices as fabrication pitch and exposure distance decrease.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM), comprising:
   a first gate structure on a substrate, wherein the first gate structure comprises:
   an interfacial layer on the substrate;
   a high-k dielectric layer on the interfacial layer; and
   a work function metal layer on the high-k dielectric layer;
   an epitaxial layer adjacent to the first gate structure;
   a first contact plug on the epitaxial layer;
   a second contact plug on the first gate structure, wherein a sidewall of the second contact plug is aligned with a sidewall of the high-k dielectric layer;
   a second gate structure adjacent to the first contact plug, wherein the first contact plug is between the first gate structure and the second gate structure;
   a first interlayer dielectric (ILD) layer around the first contact plug, the second contact plug, the first gate structure, and the second gate structure;
   a third contact plug on the first contact plug and the second gate structure, wherein a bottom surface of the third contact plug contacting the second gate structure is lower than a top surface of the first ILD layer;
   a fourth contact plug on the second contact plug, wherein a top surface of the second contact plug is less than a bottom surface of the fourth contact plug; and
   a second ILD layer around the third contact plug and the fourth contact plug.

2. The SRAM of claim 1, wherein top surfaces of the first contact plug and the second contact plug are coplanar.

3. The SRAM of claim 1, wherein top surfaces of the third contact plug and the fourth contact plug are coplanar.

4. The SRAM of claim 1, further comprising a silicide between the epitaxial layer and the first contact plug.

5. The SRAM of claim 1, wherein each of the first contact plug and the second contact plug comprises:
   a first barrier layer;
   a second barrier layer on the first barrier layer; and
   a metal layer on the second barrier layer.

6. The SRAM of claim 5, wherein the first barrier layer comprises titanium (Ti) and the second barrier layer comprises titanium nitride (TiN).

7. The SRAM of claim 5, wherein a bottom portion of the second barrier layer comprises a titanium rich portion and a top portion of the second barrier layer comprises a nitrogen rich portion.

* * * * *